US012803548B2

(12) United States Patent
Naeini

(10) Patent No.: US 12,803,548 B2
(45) Date of Patent: Nov. 17, 2026

(54) ELECTRONIC DEVICE WITH PULSE MODULATING RECEIVER

(71) Applicant: Apple Inc., Cupertino, CA (US)

(72) Inventor: Ashkan Naeini, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 19/098,761

(22) Filed: Apr. 2, 2025

(65) Prior Publication Data

US 2025/0317133 A1 Oct. 9, 2025

Related U.S. Application Data

(60) Provisional application No. 63/631,937, filed on Apr. 9, 2024.

(51) Int. Cl.
*H03K 7/08* (2006.01)
*H03K 3/017* (2006.01)
*H04L 25/49* (2006.01)

(52) U.S. Cl.
CPC ............... *H03K 7/08* (2013.01); *H03K 3/017* (2013.01); *H04L 25/4902* (2013.01)

(58) Field of Classification Search
CPC ....... H03K 7/08; H03K 3/017; H04L 25/4902
See application file for complete search history.

(56) References Cited

U.S. PATENT DOCUMENTS 7,528,760 B2 5/2009 Forejt
7,629,916 B2 12/2009 Wiesbauer et al.
7,859,442 B2 12/2010 Daniels et al.
8,134,396 B2 3/2012 Wiesbauer et al.
9,425,813 B2 8/2016 Lesso et al.
2006/0132340 A1* 6/2006 Lin ....................... G04F 10/005 341/120
2010/0135358 A1* 6/2010 McCorkle ........... G01S 13/0209 375/E1.001
2011/0074618 A1* 3/2011 Henzler ................ G04F 10/005 341/166
2024/0214018 A1 6/2024 Gambini

FOREIGN PATENT DOCUMENTS

CN 102332923 A 1/2012
CN 106656193 A 5/2017
CN 108931759 A 12/2018
CN 111427034 A 7/2020
WO 2020086578 A1 4/2020

* cited by examiner

*Primary Examiner* — David S Huang
(74) *Attorney, Agent, or Firm* — Treyz Law Group, P.C.; Michael H. Lyons

(57) ABSTRACT

An electronic device may include a receiver coupled to an antenna over a transmission line. The receiver may include a set of sample and hold circuits coupled in parallel between the transmission line and at least one pulse modulator. The pulse modulator(s) may be coupled between the sample and hold circuits and at least one time-to-digital converter (TDC). Each sample and hold circuit may be clocked using a different respective phase of a clock signal. During signal reception, the antenna may receive a radio-frequency signal. The sample and hold circuits may convert the radio-frequency signal into analog signals using the different phases of the clock signal. The pulse modulator(s) may convert voltages of the analog signals into pulse widths in at least one analog pulse width modulation (PWM) signal. The TDC(s) may convert the analog PWM signal(s) into digital codes.

20 Claims, 6 Drawing Sheets

ELECTRONIC DEVICE WITH PULSE MODULATING RECEIVER

This application claims the benefit of U.S. Provisional Patent Application No. 63/631,937, filed Apr. 9, 2024, which is hereby incorporated by reference herein in its entirety.

FIELD

This disclosure relates generally to electronic devices, including electronic devices with wireless communications circuitry.

BACKGROUND

Electronic devices are often provided with wireless communications capabilities. An electronic device with wireless communications capabilities has wireless communications circuitry with one or more antennas. Wireless receiver circuitry in the wireless communications circuitry uses the antennas to receive radio-frequency signals.

It can be challenging to form satisfactory receiver circuitry in an electronic device. If care is not taken, the receiver can exhibit insufficient signal-to-noise ratio and can consume excessive power while receiving radio-frequency signals.

SUMMARY

An electronic device may include wireless circuitry for performing wireless communications. The wireless circuitry may include a receiver coupled to an antenna over a radio-frequency transmission line path. The receiver may be a polyphase pulse modulation-based receiver.

The receiver may include a set of sample and hold circuits coupled in parallel between the radio-frequency transmission line path and at least one pulse modulator. The pulse modulator(s) may be coupled between the set of sample and hold circuits and at least one time-to-digital converter (TDC). The receiver can include one or more filters. For example, the receiver can include a pulse width modulation (PWM) low pass filter (LPF) and decimator to reduce the sampling rate of PWM by the pulse modulator(s). Each sample and hold circuit may be clocked using a different respective phase of a clock signal.

During signal reception, the antenna may receive a radio-frequency signal. The set of sample and hold circuits may convert the radio-frequency signal into a set of analog signals using the different phases of the clock signal. The pulse modulator(s) may convert voltage level information from the set of analog signals into pulse widths in at least one analog pulse width modulation (PWM) signal. The LPF and decimator may reduce a sampling rate of the PWM signal. The at least one TDC may convert the analog PWM signal(s) into at least one digital code.

An aspect of the disclosure provides a wireless receiver. The wireless receiver can include clock circuitry configured to output a clock signal. The wireless receiver can include a first sample and hold circuit configured to receive an analog radio-frequency signal, the first sample and hold circuit being further configured to generate a first analog signal based on a first phase of the clock signal and the analog radio-frequency signal. The wireless receiver can include a first pulse modulator configured to generate a first analog pulse width modulation (PWM) signal based on the clock signal and the first analog signal. The wireless receiver can include a first time-to-digital converter (TDC) configured to generate a first digital code based on the first analog PWM signal.

An aspect of the disclosure provides an electronic device. The electronic device can include an antenna. The electronic device can include a radio-frequency transmission line path coupled to the antenna. The electronic device can include a first pulse modulator. The electronic device can include a first sample and hold circuit coupled in series between the radio-frequency transmission line path and the first pulse modulator. The electronic device can include a first time-to-digital converter (TDC), the first pulse modulator being coupled in series between the first sample and hold circuit and the first TDC.

An aspect of the disclosure provides a method of receiving a radio-frequency signal using a wireless receiver. The method can include receiving, at a set of sample and hold circuits coupled in parallel between a radio-frequency transmission line path and at least one pulse modulator, a radio-frequency signal. The method can include converting, using the set of sample and hold circuits while each sample and hold circuit in the set of sample and hold circuits is clocked using a different respective phase of a clock signal, the radio-frequency signal into a set of analog signals. The method can include converting, using the at least one pulse modulator, the set of analog signals into at least one analog pulse width modulation (PWM) signal. The method can include converting, using at least one time-to-digital converter (TDC), the at least one analog PWM signal into at least one digital code.

DETAILED DESCRIPTION

Figure 1:
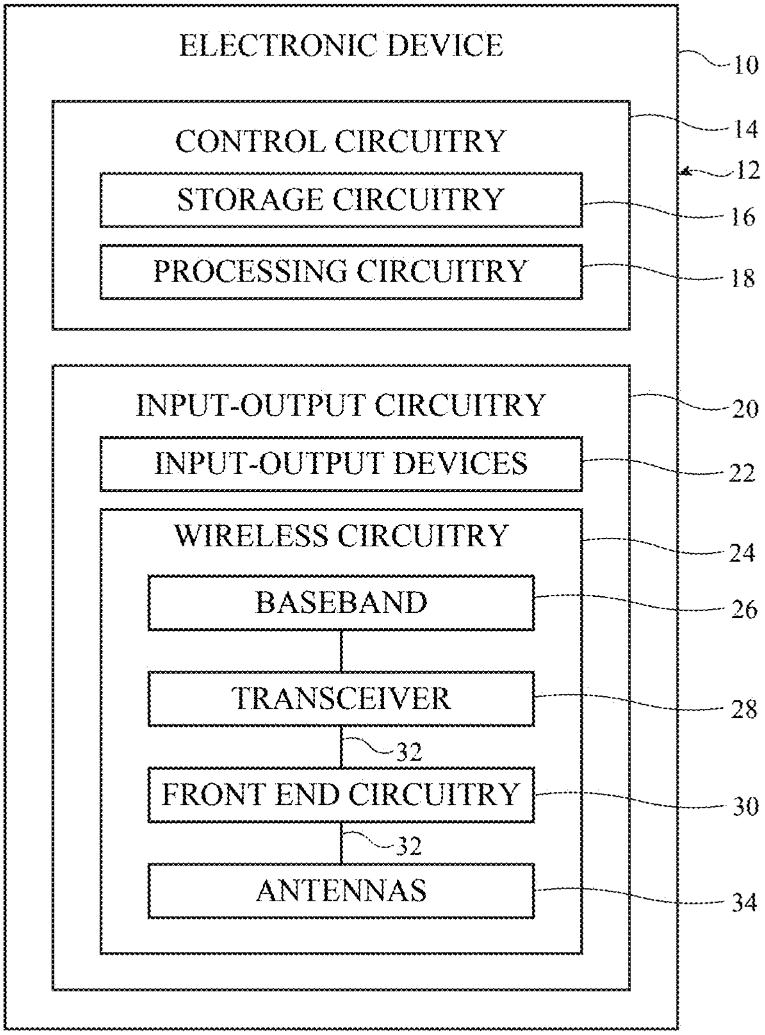
FIG. 1 is a schematic diagram of an illustrative electronic device having wireless circuitry that includes a pulse modulating receiver in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses, goggles, a helmet, or other equipment worn on a user's head (e.g., a virtual, augmented, or mixed reality headset or head-mounted display device), or other wearable or miniature device, a television, a computer display (e.g., that does not contain an embedded computer), a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, part or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors such as microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, Sixth Generation (6G) protocols, sub-THz protocols, THz protocols, etc.), antenna diversity protocols, satellite navigation system protocols (e.g., global positioning system (GPS) protocols, global navigation satellite system (GLONASS) protocols, etc.), antenna-based spatial ranging protocols, optical communications protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include baseband circuitry such as baseband circuitry 26 (e.g., one or more baseband processors and/or other circuitry that operates at baseband), radio-frequency (RF) transceiver circuitry such as transceiver 28, radio-frequency front end circuitry such as front end circuitry 30, and one or more antennas 34 (sometimes also referred to as antenna elements 34). If desired, wireless circuitry 24 may include multiple antennas 34 that are arranged into a phased antenna array (sometimes also referred to as a phased array antenna) that conveys radio-frequency signals within a corresponding signal beam that can be steered in different directions. Baseband circuitry 26 may be coupled to transceiver 28 over one or more baseband data paths. Baseband circuitry 26 may include, for example, modulators (encoders) and demodulators (decoders) that operate on baseband signals. Transceiver 28 may be coupled to antennas 34 over one or more radio-frequency transmission line paths 32. Front end circuitry 30 may be disposed on radio-frequency transmission line path(s) 32 between transceiver 28 and antennas 34.

Transceiver 28 may include transmitter circuitry (e.g., one or more transmitters), receiver circuitry (e.g., one or more receivers), modulator circuitry, photomixers, demodulator circuitry (e.g., one or more modems), radio-frequency circuitry, one or more radios, intermediate frequency circuitry, optical transmitter circuitry, optical receiver circuitry, optical light sources, other optical components, amplifier circuitry, clocking circuitry such as one or more local oscillators and/or phase-locked loops, memory, one or more registers, filter circuitry, switching circuitry, analog-to-digital converter (ADC) circuitry, digital-to-analog converter (DAC) circuitry, radio-frequency transmission lines, optical fibers, and/or any other circuitry for transmitting and/or receiving wireless signals using antennas 34. The components of transceiver 28 may be implemented on one integrated circuit, chip, system-on-chip (SOC), die, printed circuit board, substrate, or package, or the components of transceiver 28 may be distributed across two or more integrated circuits, chips, SOCs, printed circuit boards, substrates, and/or packages. If desired, baseband circuitry 26 may be integrated into the same integrated circuit, chip, system-on-chip (SOC), die, printed circuit board, substrate, or package as some or all of transceiver 28. Alternatively, baseband circuitry 26 may be integrated into a different integrated circuit, chip, system-on-chip (SOC), die, printed circuit board, substrate, or package than transceiver 28.

In the example of FIG. 1, wireless circuitry 24 is illustrated as including only a single transceiver 28 and a single radio-frequency transmission line path 32 for the sake of clarity. In general, wireless circuitry 24 may include any desired number of transceivers 28, any desired number of radio-frequency transmission line paths 32, and any desired number of antennas 34. Each transceiver 28 may be coupled to one or more antennas 34 over respective radio-frequency transmission line paths 32. Each radio-frequency transmission line path 32 may have respective front end circuitry 30 disposed thereon. If desired, front end circuitry 30 may be shared by multiple radio-frequency transmission line paths 32.

Radio-frequency transmission line path 32 may be coupled to antenna feeds on one or more antennas 34. Each antenna feed may, for example, include a positive antenna feed terminal and a ground antenna feed terminal. Radio-frequency transmission line path 32 may have a positive transmission line signal path that is coupled to the positive antenna feed terminal and may have a ground transmission line signal path that is coupled to the ground antenna feed terminal. This example is illustrative and, in general, antennas 34 may be fed using any desired antenna feeding scheme.

Radio-frequency transmission line path 32 may include transmission lines that are used to route radio-frequency antenna signals within device 10. Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 32 may be integrated into rigid and/or flexible printed circuit boards if desired.

In performing wireless transmission, baseband circuitry 26 may provide baseband signals to transceiver 28. Transceiver 28 (e.g., one or more transmitters in transceiver 28) may include circuitry for converting the baseband signals received from baseband circuitry 26 into corresponding radio-frequency signals. For example, transceiver 28 may include mixer circuitry for up-converting the baseband signals to radio frequencies prior to transmission over antennas 34. Transceiver 28 may also include digital to analog converter (DAC) and/or analog to digital converter (ADC) circuitry for converting signals between digital and analog domains. Transceiver 28 may transmit the radio-frequency signals over antennas 34 via radio-frequency transmission line path 32 and front end circuitry 30. Antennas 34 may transmit the radio-frequency signals to external wireless equipment by radiating the radio-frequency signals into free space.

In performing wireless reception, antennas 34 may receive radio-frequency signals from the external wireless equipment (e.g., a user equipment device, a wireless base station, a wireless access point, etc.). The received radio-frequency signals may be conveyed to transceiver 28 via radio-frequency transmission line path 32 and front end circuitry 30. Transceiver 28 may include circuitry for converting the received radio-frequency signals into corresponding baseband signals. Transceiver 28 may pass the baseband signals to baseband circuitry 26 for further processing (e.g., to decode wireless data encoded onto the baseband signals and to pass the decoded wireless data up the protocol stack).

Front end circuitry 30 may include radio-frequency front end components that operate on radio-frequency signals conveyed over radio-frequency transmission line path 32. If desired, the radio-frequency front end components may be formed within one or more radio-frequency front end modules (FEMs). Each FEM may include a common substrate such as a printed circuit board substrate for each of the radio-frequency front end components in the FEM. The radio-frequency front end components in front end circuitry 30 may include switching circuitry (e.g., one or more radio-frequency switches), radio-frequency filter circuitry (e.g., low pass filters, high pass filters, notch filters, band pass filters, multiplexing circuitry, duplexer circuitry, diplexer circuitry, triplexer circuitry, etc.), impedance matching circuitry (e.g., circuitry that helps to match the impedance of antennas 34 to the impedance of radio-frequency transmission line path 32), antenna tuning circuitry (e.g., networks of capacitors, resistors, inductors, and/or switches that adjust the frequency response of antennas 34), radio-frequency amplifier circuitry (e.g., power amplifier circuitry and/or low-noise amplifier circuitry), radio-frequency coupler circuitry, charge pump circuitry, power management circuitry, digital control and interface circuitry, and/or any other desired circuitry that operates on the radio-frequency signals transmitted and/or received by antennas 34.

While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband circuitry 26 and/or portions of transceiver 28 (e.g., a host processor on transceiver 28) may form a part of control circuitry 14. The baseband circuitry may, for example, access a communication protocol stack on control circuitry 14 (e.g., storage circuitry 20) to: perform user plane functions at a PHY layer, MAC layer, RLC layer, PDCP layer, SDAP layer, and/or PDU layer, and/or to perform control plane functions at the PHY layer, MAC layer, RLC layer, PDCP layer, RRC, layer, and/or non-access stratum layer.

Wireless circuitry 24 may transmit and/or receive wireless signals within corresponding frequency bands of the electromagnetic spectrum (sometimes referred to herein as communications bands or simply as "bands"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), a Wi-Fi® 7 or 8 band, and/or other Wi-Fi® bands (e.g., from 1875-5160

MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-100 GHz, near-field communications (NFC) frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Antennas 34 may be formed using any desired antenna structures. For example, antennas 34 may include antennas with resonating elements that are formed from loop antenna structures, patch antenna structures, inverted-F antenna structures, slot antenna structures, planar inverted-F antenna structures, helical antenna structures, monopole antennas, dipole antenna structures, bowtie antenna structures, cavity antenna structures, dielectric resonator antenna (DRA) structures, waveguide antenna structures, hybrids of these designs, etc. If desired, parasitic elements may be included in antennas 34 to adjust antenna performance.

Filter circuitry, switching circuitry, impedance matching circuitry, and other circuitry may be interposed within radio-frequency transmission line path 32, may be incorporated into front end circuitry 30, and/or may be incorporated into antennas 34 (e.g., to support antenna tuning, to support operation in desired frequency bands, etc.). These components, sometimes referred to herein as antenna tuning components, may be adjusted (e.g., using control circuitry 14) to tune the frequency response and wireless performance of antennas 34 over time.

In general, transceiver 28 may cover or handle any suitable communications bands of interest. The transceiver may convey radio-frequency signals using antennas 34 (e.g., antennas 34 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 34 may transmit the radio-frequency signals by radiating the radio-frequency signals into free space or to free space through intervening device structures such as a dielectric cover layer. Antennas 34 may additionally or alternatively receive the radio-frequency signals from free space or through intervening devices structures such as a dielectric cover layer. The transmission and reception of radio-frequency signals by antennas 34 each involve the excitation or resonance of antenna currents on an antenna resonating element in the antenna by the radio-frequency signals within the frequency band(s) of operation of the antennas.

In example where multiple antennas 34 are arranged in a phased antenna array, each antenna 34 may form a respective antenna element of the phased antenna array. Conveying radio-frequency signals using the phased antenna array may allow for greater peak signal gain relative to scenarios where individual antennas 34 are used to convey radio-frequency signals. In satellite navigation system links, cellular telephone links, and other long-range links, radio-frequency signals are typically used to convey data over thousands of feet or miles. In Wi-Fi® and Bluetooth® links at 2.4 and 5 GHz and other short-range wireless links, radio-frequency signals are typically used to convey data over tens or hundreds of feet. In scenarios where millimeter or centimeter wave frequencies are used to convey radio-frequency signals, a phased antenna array may convey radio-frequency signals over short distances that travel over a line-of-sight path. To enhance signal reception for millimeter and centimeter wave communications, the phased antenna array may convey radio-frequency signals using beam steering techniques (e.g., schemes in which antenna signal phase and/or magnitude for each antenna in an array are adjusted to perform beam steering).

For example, each antenna 34 in the phased antenna array may be coupled to a corresponding phase and magnitude controller in front end circuitry 30. The phase and magnitude controllers may adjust the relative phases and/or magnitudes of the radio-frequency signals that are conveyed by each of the antennas 34 in the phased antenna array. The wireless signals that are transmitted or received by the phased antenna array in a particular direction may collectively form a corresponding signal beam. The signal beam may exhibit a peak gain that is oriented in a particular pointing direction at a corresponding pointing angle (e.g., based on constructive and destructive interference from the combination of signals from each antenna in the phased antenna array). Control circuitry 14 may adjust the phase and magnitude controllers to change the direction of the signal beam over time (e.g., to allow device 10 to continue to communicate with external equipment even if the external equipment moves relative to device 10 over time). This example is illustrative and, in general, antennas 34 need not be arranged in a phased antenna array.

Transceiver 28 may include one or more receivers for receiving radio-frequency signals using one or more antennas 34. The receivers are powered by one or more corresponding power supply voltages (e.g., a Vdd power supply voltage). In some implementations, transceiver 28 includes a voltage mode direct conversion receiver. A voltage mode receiver includes a radio-frequency mixer that is clocked using a local oscillator (LO) to directly downconvert a received radio-frequency signal to baseband, a low pass filter that filters the downconverted signals, and an analog-to-digital converter that converts the downconverted signals from the analog domain into digital data in the digital domain. A digital front end, digital signal processor, or other digital circuitry may then process the signals in the digital domain.

Voltage mode receivers are generally analog intensive, are difficult to integrate into a single SOC with digital circuitry, scale weakly with process technology, are calibration intensive, exhibit minimal power consumption savings, and have a non-scaling analog area. In addition, voltage mode receivers support a signal voltage swing that is limited by the power supply voltage of the receiver. In other words, increasing the power supply voltage increases the peak voltage (amplitude) of the received signal, increasing the signal-to-noise ratio (SNR) of the signal relative to a noise floor. On the other hand, decreasing the power supply voltage decreases the peak voltage of the received signal and thus its SNR. This can cause the receiver to keep its power supply voltage relatively high to maintain a desired SNR, which can cause the receiver to consume excessive power and/or overheat.

To mitigate these issues, transceiver 28 may include a time mode direct conversion receiver such as a pulse modulating receiver. The pulse modulating receiver does not include analog-to-digital converters (ADCs) and does not include a mixer clocked by an LO to directly downconvert the radio-frequency signal to baseband. Instead, the pulse modulating receiver directly samples the received radio-frequency signal in multiple phases and converts the signal level of the received radio-frequency signal into the time domain, as a pulse width modulation (PWM) signal (e.g., where the time width of pulses in the PWM signal correspond to the signal level of the received radio-frequency signal). The PWM signal is then converted into the digital domain by a time-to-digital converter (TDC). This may allow the pulse modulating receiver to exhibit consistently high SNR even as power supply voltage is reduced, consumes substantially less chip area than a voltage mode receiver, and allows the pulse modulating receiver to be easily calibrated on the fly, for example.

Figure 2:
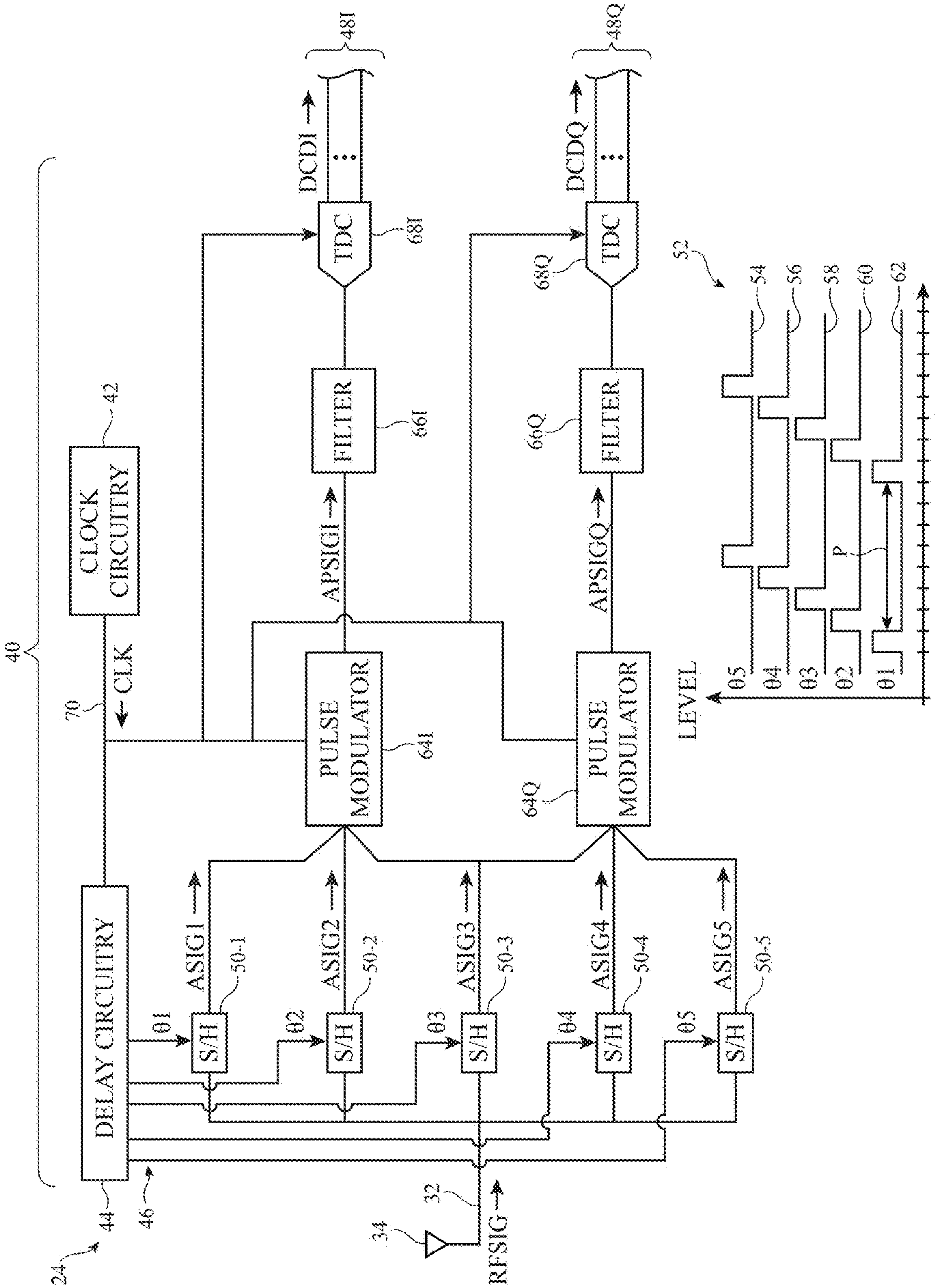
FIG. 2 is a circuit diagram of an illustrative pulse modulating receiver in accordance with some embodiments.

FIG. 2 is a circuit diagram of an illustrative pulse modulating receiver 40 that may be included wireless circuitry 24 for receiving radio-frequency signals using a corresponding antenna 34. As shown in FIG. 2, pulse modulating receiver 40 (sometimes also referred to herein simply as receiver 40 or wireless receiver 40) may have an input coupled to antenna 34 over radio-frequency transmission line path 32. Front end circuitry such as front end circuitry 30 (FIG. 1), one or more coupling capacitors, and/or one or more low noise amplifiers (LNAs) may be disposed on radio-frequency transmission line path 32 but have been omitted from FIG. 2 for the sake of clarity. If desired, the antenna 34 shown in FIG. 2 may also be coupled to a transmitter (not shown) for transmitting radio-frequency signals.

Pulse modulating receiver 40 may include one or more receiver (RX) chains such as an in-phase receiver chain 481 and a quadrature-phase receiver chain 48Q. Receiver chains 481 and 48Q may pass in-phase and quadrature-phase (I/Q) signals to the output of pulse modulating receiver 40, which may be coupled to an input of baseband circuitry 26 of FIG. 1. Some or all of pulse modulating receiver 40 may be integrated into the same integrated circuit, chip, system-on-chip (SOC), die, printed circuit board, substrate, or package as baseband circuitry 26. Alternatively, pulse modulating receiver 40 may be disposed on a separate integrated circuit, chip, system-on-chip (SOC), die, printed circuit board, substrate, or package than transceiver 28.

Pulse modulating receiver 40 may include two or more sample and hold (S/H) circuits 50 coupled in parallel between radio-frequency transmission line path 32 and receiver chains 481 and 48Q. Sample and hold circuits 50 are sometimes also referred to herein as sample and holds 50, sample and hold circuitry 50, sample and hold blocks 50, or samplers 50. Sample and hold circuits 50 may have inputs coupled to radio-frequency transmission line path 32 and may have outputs coupled to one or both of receiver chains 481 and 48Q.

In the example of FIG. 2, pulse modulating receiver 40 includes five sample and hold circuits 50-1, 50-2, 50-3, 50-4, and 50-5. This is illustrative and non-limiting. Pulse modulating receiver 40 may include as few as two sample and hold circuits 50 if desired (e.g., a first sample and hold circuit 50-2 coupled between radio-frequency transmission line path 32 and in-phase receiver chain 481 for conveying in-phase signals and a second sample and hold circuit 50-4 coupled to between radio-frequency transmission line path 32 and quadrature-phase receiver chain 48Q for conveying quadrature-phase signals). More generally, pulse modulating receiver 40 may include N sample and hold circuits 50, where N is an integer greater than or equal to 2 (e.g., pulse modulating receiver 40 may include three sample and hold circuits 50, four sample and hold circuits 50, more than five sample and hold circuits 50, etc.). In the example of FIG. 2, N=5. Implementing pulse modulating receiver 40 with more than two sample and hold circuits 50 may help to cancel out higher order harmonics in the received signal, for example. When N is greater than two, sample and hold circuits 50 are sometimes referred to collectively as a polyphase sampler, polyphase mixer, or polyphase downconverter.

In-phase receiver chain 481 may include pulse modulation circuitry such as pulse modulator 64I, filter circuitry such as filter 66I, and time-to-digital converter circuitry such as TDC 68I. The input of pulse modulator 64I may be coupled to the output of one or more sample and hold circuits 50. The output of pulse modulator 64I may be coupled to the input of filter 66I. The output of filter 66I may be coupled to the input of TDC 68I. The output of TDC 68I may be communicatively coupled to baseband circuitry 26 (FIG. 1) via an output of pulse modulating receiver 40.

Quadrature-phase receiver chain 48Q may include pulse modulation circuitry such as pulse modulator 64Q, filter circuitry such as filter 66Q, and time-to-digital converter circuitry such as TDC 68Q. The input of pulse modulator 64Q may be coupled to the output of one or more sample and hold circuits 50. The output of pulse modulator 64Q may be coupled to the input of filter 66Q. The output of filter 66Q may be coupled to the input of TDC 68Q. The output of TDC 68Q may be communicatively coupled to baseband circuitry 26 (FIG. 1) via an output of pulse modulating receiver 40. Pulse modulators 64 (e.g., pulse modulator 64Q and pulse modulator 64I) are sometimes also referred to herein as pulse width modulators 64 or pulse width modulation circuits 64.

As shown in FIG. 2, sample and hold circuit 50-1 may have an input coupled to radio-frequency transmission line path 32. Sample and hold circuit 50-1 may have an output coupled to the input of pulse modulator 64I. Sample and hold circuit 50-2 may have an input coupled to radio-frequency transmission line path 32. Sample and hold circuit 50-2 may have an output coupled to the input of pulse modulator 64I. Sample and hold circuit 50-3 may have an input coupled to radio-frequency transmission line path 32. Sample and hold circuit 50-3 may have an output coupled to the input of pulse modulator 64I and the input of pulse modulator 64Q (e.g., sample and hold circuits 50-1, 50-2, and 50-3 may be coupled in parallel between radio-frequency transmission line path 32 and pulse modulator 64I). Sample and hold circuit 50-4 may have an input coupled to radio-frequency transmission line path 32. Sample and hold circuit 50-4 may have an output coupled to the input of pulse modulator 64Q. Sample and hold circuit 50-5 may have an input coupled to radio-frequency transmission line path 32. Sample and hold circuit 50-5 may have an output coupled to the input of pulse modulator 64Q (e.g., sample and hold circuits 50-3, 50-4, and 50-5 may be coupled in parallel between radio-frequency transmission line path 32 and pulse modulator 64Q).

Pulse modulating receiver 40 may be clocked using clock circuitry 42 and delay circuitry 44. Clock circuitry 42 may be, for example, local oscillator (LO) based clocking circuitry. If desired, clock circuitry 42 may include one or more voltage controlled oscillators, PLLs, frequency locked loops (FLLs), and/or any other desired clocking circuitry. The output of clock circuitry 42 may be coupled to the input of delay circuitry 44 and clock inputs of pulse modulators 64I and 64Q over clocking path 70. Clock circuitry 42 may generate clock signal CLK and may provide clock signal CLK to delay circuitry 44, pulse modulator 64I, and pulse modulator 64Q over clocking path 70. Clock signal CLK may be, for example, a clocking signal that periodically pulses high with a period P.

Delay circuitry 44 may clock sample and hold circuits 50 using clock signal CLK. Delay circuitry 44 may include one or more delay stages, delay chains, delay circuits, and/or other delay circuitry that provides different delays to clock signal CLK. The output of delay circuitry 44 may be coupled to clock inputs of sample and hold circuits 50 over respective delayed clocking paths 46. Delay circuitry 44 may output delayed versions of clock signal CLK onto different delayed clocking paths 46. Delay circuitry 44 may apply a different amount of time delay and thus a different phase shift to clock signal CLK for each sample and hold circuit 50. Delay circuitry 44 may provide a different respective phase θ of clock signal CLK (e.g., clock signal CLK as time-delayed by a different respective amount or equivalently as phase-shifted by a different respective amount) to each sample and hold circuit 50 over the corresponding delayed clocking path 46.

For example, as shown in FIG. 2, delay circuitry 44 may provide clock signal CLK at phase θ1 to the clock input of sample and hold circuit 50-1, may provide clock signal CLK at phase θ2 to the clock input of sample and hold circuit 50-2, may provide clock signal CLK at phase θ3 to the clock input of sample and hold circuit 50-3, may provide clock signal CLK at phase θ4 to the clock input of sample and hold circuit 50-4, and may provide clock signal CLK at phase θ5 to the clock input of sample and hold circuit 50-5. Timing diagram 52 of FIG. 2 illustrates the different phases θ of clock signal CLK as provided by delay circuitry 44 to sample and hold circuits 50-1 through 50-5. The different phases of clock signal CLK may be provided to sample and hold circuits 50-1 through 50-5 at the RF receiver frequency of pulse modulating receiver 40 (e.g., at the frequency of the RF signals received by the pulse modulating receiver rather than at a double sampling rate as required by an ADC).

As shown in timing diagram 52, curve 62 plots clock signal CLK at phase θ1 as provided to sample and hold circuit 50-1. Curve 60 plots clock signal CLK at phase θ2 as provided to sample and hold circuit 50-2. Curve 58 plots clock signal CLK at phase θ3 as provided to sample and hold circuit 50-3. Curve 56 plots clock signal CLK at phase θ4 as provided to sample and hold circuit 50-4. Curve 54 plots clock signal CLK at phase θ5 as provided to sample and hold circuit 50-5.

As shown by curves 54-62, clock signal CLK has period P between consecutive clock pulses. Delay circuitry 44 may output clock signal CLK with phases θ that are separated (shifted) in angle space by 180°/(N−1) relative to the previous and/or subsequent phase θ, where N is the number of sample and hold circuits 50. In the example of FIG. 2, phases θ are separated in angle space by 180°/(5-1)=45°. As such, delay circuitry 44 may clock sample and hold circuit 50-1 using clock signal CLK at phase θ1=0° (e.g., delay circuitry 44 may pass clock signal CLK to sample and hold circuit 50-1 without any time delay or, alternatively, the clock input of sample and hold circuit 50 may be coupled to clocking path 70), may clock sample and hold circuit 50-2 using clock signal CLK at phase θ2=45°, may clock sample and hold circuit 50-3 using clock signal CLK at phase θ3=90°, may clock sample and hold circuit 50-4 using clock signal CLK at phase θ1=135°, and may clock sample and hold circuit 50-5 using clock signal CLK at phase θ5=180°.

While sometimes referred to herein as providing clock signal CLK to sample and hold circuits 50 at different phases θ, delay circuitry 44 is sometimes also referred to herein as providing different phases θ of clock signal CLK to sample and hold circuits 50 (e.g., delay circuitry 44 may provide phase θ1 of clock signal CLK to sample and hold circuit 50-1, may provide phase θ2 of clock signal CLK to sample and hold circuit 50-2, may provide phase θ3 of clock signal CLK to sample and hold circuit 50-3, etc.). Sample and hold circuits 50 may sample and hold a radio-frequency signal received over radio-frequency transmission line path 32 using (based on) its respective phase θ of clock signal CLK.

During signal reception, antenna 34 may receive an analog radio-frequency signal RFSIG (e.g., from an external device or as transmitted by device 10 and reflected off an external object). Analog radio-frequency signal RFSIG may, in some implementations, carry wireless data (e.g., wireless data packets, data frames, etc.). Antenna 34 may pass analog radio-frequency signal RFSIG onto radio-frequency transmission line path 32. One or more low noise amplifiers (not shown) disposed on radio-frequency transmission line path 32 may amplify analog radio-frequency signal RFSIG. Radio-frequency transmission line path 32 may pass analog radio-frequency signal RFSIG to the inputs of sample and hold circuits 50 (e.g., over a radio-frequency signal splitter, radio-frequency signal couplers, etc.).

Each sample and hold circuit 50 may sample and hold analog radio-frequency signal RFSIG, according to its respective phase θ of clock signal CLK, to produce a corresponding analog signal ASIGi (e.g., where i is an integer index from 1 to N, N being equal to 5 in the example of FIG. 2). A given sample and hold circuit 50 may, for example, lock, freeze, and/or latch the signal level (e.g., voltage level) of analog radio-frequency signal RFSIG at the time of the rising edge of each pulse in its corresponding phase θ of clock signal CLK. The sample and hold circuit 50 may output analog signal ASIGi having a signal level that is given by the locked, frozen, and/or latched signal level of analog radio-frequency signal RFSIG. The signal level (e.g., voltage level) of analog signal ASIGi remains constant until the next pulse of its corresponding phase θ of clock signal CLK. Because analog signal ASIGi and analog radio-frequency signal RFSIG are both analog signals, sample and hold circuits 50 are not ADCs. Each sample and hold circuit 50 may include one or more capacitors (e.g., for storing a locked level of analog radio-frequency signal RFSIG), one or more switches or transistors, one or more amplifiers, and/or other sample and hold circuitry. Each sample and hold circuit 50 may effectively down-sample analog radio-frequency signal RFSIG to the corresponding analog signal ASIGi at baseband.

Figure 3:
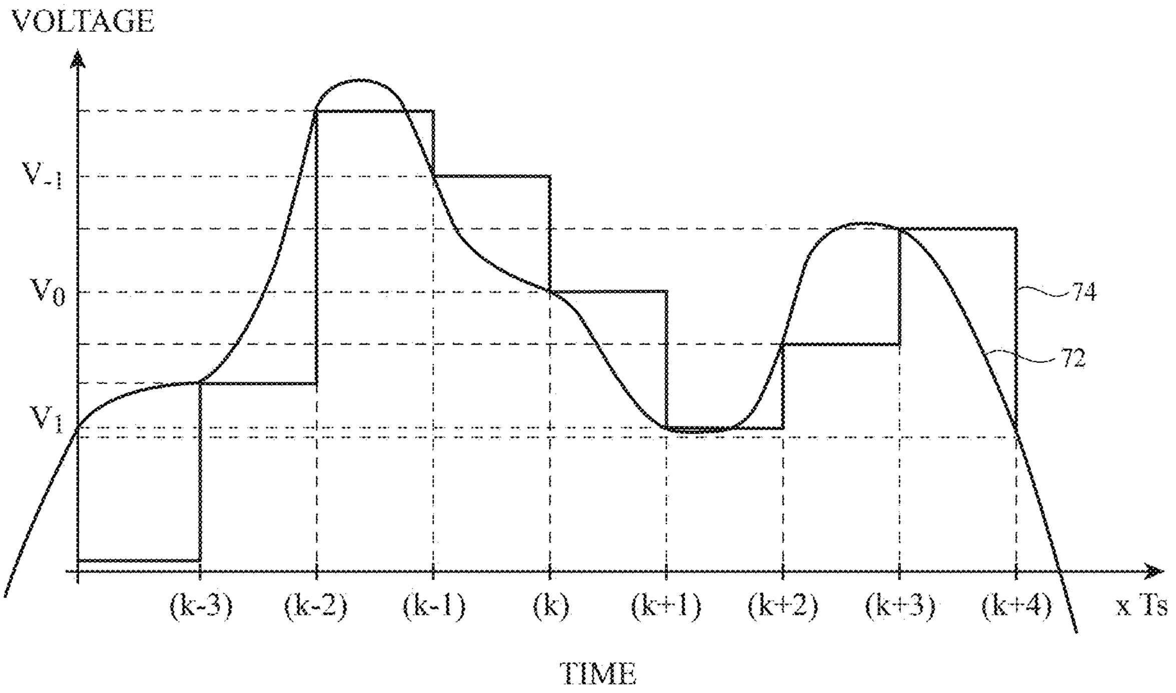
FIG. 3 is a timing diagram showing how an illustrative sample and hold circuit in a pulse modulating receiver may generate an analog signal based on a received radio-frequency signal in accordance with some embodiments.

FIG. 3 is a timing diagram showing how a given sample and hold circuit 50 may generate an analog signal ASIGi based on analog radio-frequency signal RFSIG and a corresponding phase θ of clock signal CLK. Curve 72 of FIG. 3 plots the voltage level of analog radio-frequency signal RFSIG over time. Curve 74 plots the voltage level of the corresponding analog signal ASIGi generated by sample and hold circuit 50 based on radio-frequency signal RFSIG and phase θ of clock signal CLK.

Integer index k of FIG. 3 is used to denote different instances in time when the phase θ of clock signal CLK is pulsed high or exhibits a rising pulse edge that causes sample and hold circuit 50 to sample and hold the corresponding analog signal ASIGi. The example of FIG. 3 plots the operation of sample and hold circuit 50 from sample time (k−3) to sample time (k+4). Each sampling time/instance is separated from the next sampling time/instance and the previous sampling time/instance by period P of FIG. 2. At each sampling time, sample and hold circuit 50 samples and locks the voltage level of the received analog radio-frequency signal RFSIG and outputs analog signal ASIGi at a constant signal level equal to the sampled and locked voltage level, until the next pulse in phase θ of clock signal CLK.

For example, at sample time (k−1), analog radio-frequency signal RFSIG has voltage level $V_{-1}$. The pulse in phase θ of clock signal CLK at sample time (k−1) triggers or causes sample and hold circuit 50 to lock in voltage level $V_{-1}$ and to output analog signal ASIGi at the locked-in (constant) voltage level $V_{-1}$, until the next pulse of clock signal CLK. At sample time k (e.g., the next rising edge of clock signal CLK after sample time (k−1)), analog radio-frequency signal RFSIG has reduced to voltage level $V_0$. The pulse in phase θ of clock signal CLK at sample time k triggers sample and hold circuit 50 to lock in voltage level $V_0$ (e.g., replacing the previous locked voltage level $V_{-1}$) and to output analog signal ASIGi at the locked-in (constant) voltage level $V_0$, until the next pulse of clock signal CLK. At sample time (k+1) (e.g., the next rising edge of clock signal CLK after sample time k), analog radio-frequency signal RFSIG has further reduced to voltage level $V_1$. The pulse in phase θ of clock signal CLK at sample time (k+1) triggers sample and hold circuit 50 to lock in voltage level $V_1$ (e.g., replacing the previous locked voltage level $V_0$) and to output analog signal ASIGi at the locked-in (constant) voltage level $V_1$, until the next pulse of clock signal CLK. This process may continue as sample and hold circuit 50 continues to receive analog radio-frequency signal RFSIG while clocked using its corresponding phase θ of clock signal CLK.

Returning to FIG. 2, each sample and hold circuit 50 may generate a corresponding analog signal ASIGi based on the received analog radio-frequency signal RFSIG and its corresponding phase θ of clock signal CLK. For example, as shown in FIG. 2, sample and hold circuit 50-1 may generate analog signal ASIG1 based on analog radio-frequency signal RFSIG and phase θ1 of clock signal CLK, sample and hold circuit 50-2 may generate analog signal ASIG2 based on analog radio-frequency signal RFSIG and phase θ2 of clock signal CLK, sample and hold circuit 50-3 may generate analog signal ASIG3 based on analog radio-frequency signal RFSIG and phase θ3 of clock signal CLK, sample and hold circuit 50-4 may generate analog signal ASIG4 based on analog radio-frequency signal RFSIG and phase θ4 of clock signal CLK, and sample and hold circuit 50-5 may generate analog signal ASIG5 based on analog radio-frequency signal RFSIG and phase θ5 of clock signal CLK. Pulse modulator 64I may receive analog signals ASIG1, ASIG2, and ASIG3 from sample and hold circuits 50-1, 50-2, and 50-3, respectively. Pulse modulator 64Q may receive analog signals ASIG3, ASIG4, and ASIG5 from sample and hold circuits 50-3, 50-4, and 50-5, respectively.

Pulse modulators 64I and 64Q may perform pulse width modulation on the received analog signals ASIGi while clocked using clock signal CLK (e.g., at phase θ1) to produce corresponding analog PWM signals APSIG. For example, pulse modulator 64I may generate an in-phase analog PWM signal APSIGI based on analog signal ASIG1, analog signal ASIG2, analog signal ASIG3, and clock signal CLK. Pulse modulator 64Q may generate a quadrature-phase analog PWM signal APSIGQ based on analog signal ASIG3, analog signal ASIG4, analog signal ASIG5, and clock signal CLK.

A given pulse modulator 64 may convert the voltage levels of its received analog signals ASIGi into corresponding time information (e.g., performing analog-to-time conversion from the analog domain to the time domain). Pulse modulator 64 may, for example, encode the voltage levels of the received analog signals ASIGi into different time domain pulse widths of analog PWM signal APSIG.

Figure 4:
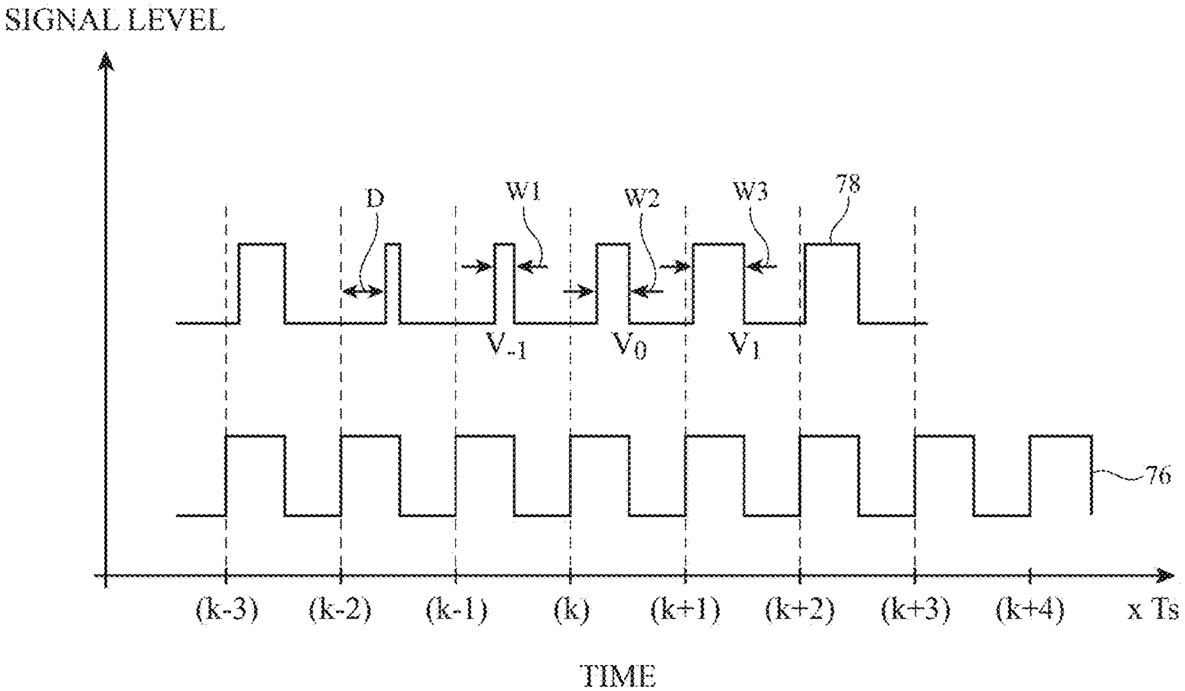
FIG. 4 is a timing diagram showing how an illustrative pulse modulator in a pulse modulating receiver may generate an analog pulse width modulation signal based on a clock signal and an analog signal output by a sample and hold circuit in accordance with some embodiments.

FIG. 4 is a timing diagram showing how a pulse modulator 64 may generate a corresponding analog PWM signal APSIG based on clock signal CLK and an analog signal ASIGi received from a sample and hold circuit 50. Curve 76 of FIG. 4 plots clock signal CLK as received at pulse modulator 64 over time. Curve 78 plots the analog PWM signal APSIG output by pulse modulator 64 over time based on clock signal CLK, in an example where pulse modulator 64 receives the analog signal ASIGi represented by curve 74 of FIG. 3.

At each rising edge of clock signal CLK, pulse modulator 64 may output a pulse of analog PWM signal APSIG having a pulse width W that is given by the voltage level of analog signal ASIGi at the time of the rising edge. A higher voltage levels of analog signal ASIGi may produce a greater duration D between the rising edge of clock signal CLK and the rising edge of the corresponding pulse of analog PWM signal APSIG than a lower voltage level. As such, a higher voltage level of analog signal ASIGi may also produce a smaller width W of the corresponding pulse in analog PWM signal APSIG than a lower voltage level. Durations D and thus widths W may serve to encode, in time, information identifying the voltage levels of analog signal ASIGi at each sampling time.

For example, at sampling time (k−1), analog signal ASIGi has a relatively high voltage level $V_{-1}$ (FIG. 3), causing the next pulse of analog PWM signal APSIG to have a relatively narrow width W1. At sampling time k, analog signal ASIGi has a lower voltage level $V_0$ (FIG. 3), causing the next pulse of analog PWM signal APSIG to have a wider width W2. At sampling time (k+1), analog signal ASIGi has an even lower voltage level $V_1$ (FIG. 3), causing the next pulse of analog PWM signal APSIG to have an even wider width W3. In this way, pulse modulator 64 may pulse width modulate analog PWM signal APSIG based on clock signal CLK and analog signal ASIGi, effectively converting the analog voltage level information in analog signal ASIGi into time information in analog PWM signal APSIG.

Returning to FIG. 2, pulse modulator 64I may provide in-phase analog PWM signal APSIGI to filter 66I. Pulse modulator 64Q may provide quadrature-phase analog PWM signal APSIGQ to filter 66Q. Filters 66 may be programmable finite impulse response (FIR) filters, as one example. Filter 66I may include a PWM lowpass filter (LPF) and/or decimator. Filter 66I may filter and/or decimate in-phase analog PWM signal APSIGI (e.g., producing a filtered in-phase analog PWM signal APSIGI). Filter 66Q may include a PWM lowpass filter (LPF) and/or decimator. Filter 66Q may filter and/or decimate quadrature-phase analog PWM signal APSIGQ (e.g., producing a filtered quadrature-phase analog PWM signal APSIGQ). Filters 66 may, for example, decimate the received analog PWM signal APSIG to reduce the sampling rate of analog PWM signal APSIG, helping to conserve power during subsequent processing by TDCs 68 and helping to minimize the complexity of TDCs 68. Filters 66 may be omitted if desired.

Filter 66I may provide the filtered in-phase analog PWM signal APSIGI to TDC 68I. Filter 66Q may provide the filtered quadrature-phase analog PWM signal APSIGQ to TDC 68Q. TDC 68I may perform time-to-digital conversion on the filtered in-phase analog PWM signal APSIGI (e.g., from the time domain to the digital domain), generating a corresponding in-phase digital code DCDI. TDC 68Q may perform time-to-digital conversion on the filtered quadrature-phase analog PWM signal APSIGQ, generating a corresponding quadrature-phase digital code DCDQ. The values of digital codes DCDI and DCDQ may correspond to the analog pulse widths W of analog PWM signals APSIG (e.g., as produced in the time domain by pulse modulators 64) and thus the voltage level of one or more analog signals ASIGi (e.g., as produced in the analog domain by one or more sample and hold circuits 50) and thus the voltage level of analog radio-frequency signal RFSIG (e.g., as received by antenna 34). TDCs 68 may provide digital codes DCDI and DCDQ to baseband circuitry 26 (FIG. 1) for subsequent processing (e.g., to decode or demodulate the wireless data carried by the analog radio-frequency signal RFSIG received by antenna 34).

Figure 5:
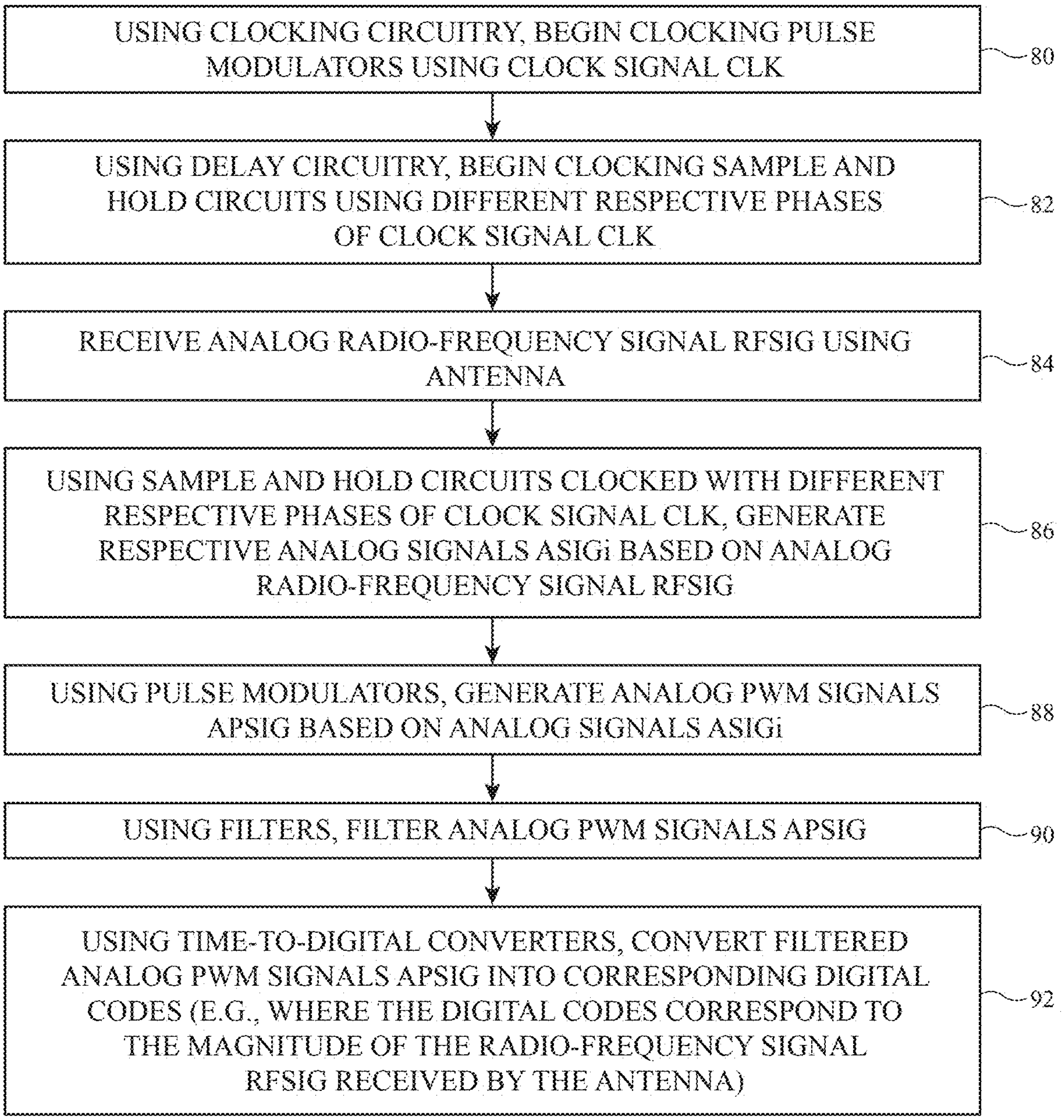
FIG. 5 is a flow chart of illustrative operations involved in receiving radio-frequency signals using a pulse modulating receiver in accordance with some embodiments.

FIG. 5 is a flow chart of illustrative operations involved in receiving analog radio-frequency signal RFSIG using pulse modulating receiver 40. At operation 80, clock circuitry 42 may begin to generate clock signal CLK. Clock circuitry 42 may begin to provide clock signal CLK to delay circuitry 44 and pulse modulators 64 over clocking path 70. Clock circuitry 42 may continue to generate clock signal CLK and may continue to clock delay circuitry 44 and pulse modulators 64 using clock signal CLK during the remaining operations of FIG. 5.

At operation 82, delay circuitry 44 may begin to generate different phases θ of clock signal CLK for each sample and hold circuit 50 (e.g., by applying different time delays to clock signal CLK for each sample and hold circuit 50). Delay circuitry 44 may begin to provide different respective phases θ of clock signal CLK to the clock input of each sample and hold circuit 50 over delayed clocking paths 46. Delay circuitry 44 may continue to clock each sample and hold circuit 50 using its respective phase θ of clock signal CLK during the remaining operations of FIG. 5.

At operation 84, antenna 34 may receive analog radio-frequency signal RFSIG. Antenna 34 may pass analog radio-frequency signal RFSIG to sample and hold circuits 50 over radio-frequency transmission line path 32.

At operation 86, each sample and hold circuit 50 may generate, produce, or output a respective analog signal ASIGi based on its phase θ of clock signal CLK (as received from delay circuitry 44) and analog radio-frequency signal RFSIG (e.g., as shown in FIG. 3). Sample and hold circuits 50 may provide analog signals ASIGi to pulse modulators 64.

At operation 88, pulse modulators 64 may generate, produce, or output analog PWM signals APSIG based on clock signal CLK and one or more of the analog signals ASIGi received from sample and hold circuits 50 (e.g., converting voltage levels in the analog domain to pulse widths W in the time domain as shown in FIG. 4). Pulse modulators 64 may provide analog PWM signals APSIG to filters 66.

At operation 90, filters 66 may filter analog PWM signals APSIG to produce corresponding filtered analog PWM signals APSIG. Operation 90 may be omitted in implementations where filters 66 are omitted. Filters 66 may provide the filtered analog PWM signals APSIG to TDCs 68.

At operation 92, TDCs 68 may generate digital codes DCDI and DCDQ based on the filtered analog PWM signals APSIG (e.g., converting the information in analog PWM signals APSIG from the time domain into the digital domain as different values of digital codes DCDI and DCDQ). TDCs 68 may provide the digital codes to baseband circuitry 26 (FIG. 1) for further processing.

Figure 6:
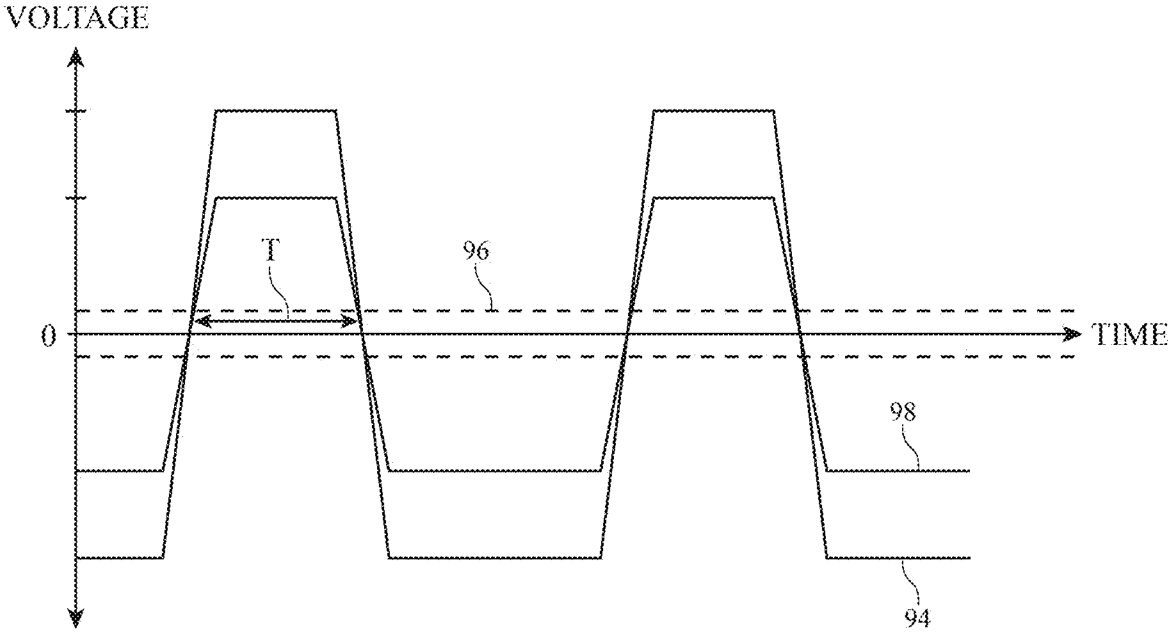
FIG. 6 is a timing diagram showing how the power supply voltage of a pulse modulating receiver may be reduced without sacrificing signal-to-noise ratio in accordance with some embodiments.

FIG. 6 is a timing diagram showing how pulse modulating receiver 40 may reduce power consumption without sacrificing SNR of the received signal. Curve 98 of FIG. 6 plots the voltage level of a pulse width modulated signal such as analog PWM signal APSIG when pulse modulating receiver 40 is powered using a relatively low power supply voltage. Curve 94 plots the voltage level of the pulse width modulated signal when pulse modulating receiver 40 is powered using a relatively high power supply voltage. As shown by curves 94 and 98, higher power supply voltages increase the amplitude of the pulse width modulated signal. The pulse width modulated signal encodes information in the pulse width T of the pulse width modulated signal rather than in the amplitude of the signal. As shown by curves 98 and 94, pulse width T remains the same regardless of power supply voltage. As such, the information encoded in pulse width T will exhibit the same relatively high SNR even if power supply voltage is reduced to conserve power in the receiver.

On the other hand, voltage mode receivers that rely on information carried by the amplitude of the signal exhibit a lower SNR when the lower power supply voltage is used than when the higher power supply voltage is used. This is because the lower power supply voltage limits the amplitude of the voltage signal and thus the ratio of the amplitude of the voltage signal to noise floor 96 relative to a higher power supply voltage (i.e., the SNR). As such, the voltage mode receiver may need to continue to use a high power supply voltage to achieve a sufficiently high SNR. In contrast, pulse modulating receiver 40 may reach sufficiently high SNR while using a lower power supply voltage, thereby conserving power and limiting thermal effects, because information is encoded in pulse width T rather than voltage amplitude.

As used herein, the term "concurrent" means at least partially overlapping in time. In other words, first and second events are referred to herein as being "concurrent" with each other if at least some of the first event occurs at the same time as at least some of the second event (e.g., if at least some of the first event occurs during, while, or when at least some of the second event occurs). First and second events can be concurrent if the first and second events are simultaneous (e.g., if the entire duration of the first event overlaps the entire duration of the second event in time) but can also be concurrent if the first and second events are non-simultaneous (e.g., if the first event starts before or after the start of the second event, if the first event ends before or after the end of the second event, or if the first and second events are partially non-overlapping in time). As used herein, the term "while" is synonymous with "concurrent."

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The methods and operations described above in connection with FIGS. 1-6 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. A wireless receiver comprising:

clock circuitry configured to output a clock signal;

a first sample and hold circuit configured to receive an analog radio-frequency signal, the first sample and hold circuit being further configured to generate a first analog signal based on a first phase of the clock signal and the analog radio-frequency signal;

a first pulse modulator configured to generate a first analog pulse width modulation (PWM) signal based on the clock signal and the first analog signal; and a first time-to-digital converter (TDC) configured to generate a first digital code based on the first analog PWM signal.

2. The wireless receiver of claim 1, wherein the first pulse modulator is configured to convert voltage levels of the first analog signal into pulse widths of the first analog PWM signal.

3. The wireless receiver of claim 2, wherein the first sample and hold circuit is configured to sample and hold voltage levels of the analog radio-frequency signal at a set of sample times, the first analog signal having constant voltage levels between the sample times in the set of sample times.

4. The wireless receiver of claim 1, further comprising:

a second sample and hold circuit configured to receive the analog radio-frequency signal, the second sample and hold circuit being further configured to generate a second analog signal based on a second phase of the clock signal and the analog radio-frequency signal, the second phase of the clock signal being different than the first phase of the clock signal, and the first pulse modulator being configured to generate the first analog PWM signal based on the second analog signal.

5. The wireless receiver of claim 1, further comprising:

a second sample and hold circuit configured to receive the analog radio-frequency signal, the second sample and hold circuit being further configured to generate a second analog signal based on a second phase of the clock signal and the analog radio-frequency signal, the second phase of the clock signal being different than the first phase of the clock signal;

a second pulse modulator configured to generate a second analog PWM signal based on the clock signal and the second analog signal; and a second TDC configured to generate a second digital code based on the second analog PWM signal.

6. The wireless receiver of claim 5, wherein the second phase of the clock signal is 90 degrees out of phase with respect to the first phase of the clock signal.

7. The wireless receiver of claim 5, further comprising:

a third sample and hold circuit configured to receive the analog radio-frequency signal, wherein the third sample and hold circuit is further configured to generate a third analog signal based on a third phase of the clock signal and the analog radio-frequency signal, the third phase of the clock signal is between the first phase and the second phase of the clock signal, the first pulse modulator is configured to generate the first analog PWM signal based on the third analog signal, and the second pulse modulator is configured to generate the second analog PWM signal based on the third analog signal.

8. The wireless receiver of claim 7, further comprising:

a fourth sample and hold circuit configured to receive the analog radio-frequency signal, wherein the fourth sample and hold circuit is further configured to generate a fourth analog signal based on a fourth phase of the clock signal and the analog radio-frequency signal, the first phase of the clock signal is between the fourth phase and the third phase of the clock signal, and the first pulse modulator is configured to generate the first analog PWM signal based on the fourth analog signal.

9. The wireless receiver of claim 8, further comprising:

a fifth sample and hold circuit configured to receive the analog radio-frequency signal, wherein the fifth sample and hold circuit is further configured to generate a fifth analog signal based on a fifth phase of the clock signal and the analog radio-frequency signal, the second phase of the clock signal is between the fifth phase and the third phase of the clock signal, and the second pulse modulator is configured to generate the second analog PWM signal based on the fifth analog signal.

10. The wireless receiver of claim 1, further comprising:

a radio-frequency transmission line path, the first sample and hold circuit being coupled in series between the radio-frequency transmission line path and the first pulse modulator;

a filter and decimator coupled in series between the first pulse modulator and the first TDC; and delay circuitry configured to generate the first phase of the clock signal by applying a time delay to the clock signal output by the clock circuitry.

11. An electronic device comprising:

an antenna;

a radio-frequency transmission line path coupled to the antenna;

a first pulse modulator;

a first sample and hold circuit coupled in series between the radio-frequency transmission line path and the first pulse modulator; and a first time-to-digital converter (TDC), the first pulse modulator being coupled in series between the first sample and hold circuit and the first TDC.

12. The electronic device of claim 11, further comprising:

a second sample and hold circuit coupled in parallel with the first sample and hold circuit between the radio-frequency transmission line path and the first pulse modulator.

13. The electronic device of claim 12, further comprising:

a second pulse modulator; and a second TDC, the second pulse modulator being coupled in series between the second sample and hold circuit and the second TDC.

14. The electronic device of claim 13, further comprising: a third sample and hold circuit coupled in parallel with the second sample and hold circuit between the radio-frequency transmission line path and the second pulse modulator.

15. The electronic device of claim 14, further comprising: a fourth sample and hold circuit coupled in parallel with the first and second sample and hold circuits between the radio-frequency transmission line path and the first pulse modulator; and a fifth sample and hold circuit coupled in parallel with the first and second sample and hold circuits between the radio-frequency transmission line path and the second pulse modulator.

16. The electronic device of claim 13, further comprising: clock circuitry configured to generate a clock signal, wherein the first pulse modulator and the second pulse modulator are clocked using the clock signal; and delay circuitry configured to clock the first sample and hold circuit using a first phase of the clock signal and configured to clock the second sample and hold circuit using a second phase of the clock signal that is different than the first phase of the clock signal.

17. The electronic device of claim 11, further comprising: a second pulse modulator;

a second sample and hold circuit coupled in series between the radio-frequency transmission line path and the second pulse modulator, wherein the first sample and hold circuit is clocked using a first phase of a clock signal and the second sample and hold circuit is clocked using a second phase of the clock signal that is different than the first phase of the clock signal; and a second TDC, the second pulse modulator being coupled in series between the second sample and hold circuit and the second TDC.

18. A method of receiving a radio-frequency signal using a wireless receiver, the method comprising:

receiving, at a set of sample and hold circuits coupled in parallel between a radio-frequency transmission line path and at least one pulse modulator, the radio-frequency signal;

converting, using the set of sample and hold circuits while each sample and hold circuit in the set of sample and hold circuits is clocked using a different respective phase of a clock signal, the radio-frequency signal into a set of analog signals;

converting, using the at least one pulse modulator, the set of analog signals into at least one analog pulse width modulation (PWM) signal; and converting, using at least one time-to-digital converter (TDC), the at least one analog PWM signal into at least one digital code.

19. The method of claim 18, further comprising:

filtering and decimating the at least one analog PWM signal prior to converting the at least one analog PWM signal using the at least one TDC.

20. The method of claim 18, wherein converting the set of analog signals into the at least one analog PWM signal comprises converting voltage levels in the set of analog signals into pulse widths in the at least one analog PWM signal.

* * * * *